United States Patent
Dumas

(10) Patent No.: US 6,377,088 B1
(45) Date of Patent: Apr. 23, 2002

(54) SHARP TRANSITION PUSH-PULL DRIVE CIRCUIT WITH SWITCHING SIGNAL INPUT CIRCUIT

(75) Inventor: Jeffrey G. Dumas, West Warwick, RI (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/621,037

(22) Filed: Jul. 21, 2000

(51) Int. Cl.$^7$ ................................................. H03B 1/00
(52) U.S. Cl. ......................... 327/112; 327/578; 326/89
(58) Field of Search .................................. 327/108, 109, 327/110, 111, 112, 165, 574, 578, 376, 377, 198, 259; 326/17, 18, 19, 20–24, 29, 89, 90, 91

(56) References Cited

U.S. PATENT DOCUMENTS

| | | | |
|---|---|---|---|
| 4,698,525 A | * 10/1987 | Tavana et al. | 326/19 |
| 4,849,651 A | 7/1989 | Estes, Jr. | 307/125 |
| 5,097,150 A | * 3/1992 | Satou et al. | 326/110 |
| 5,247,207 A | * 9/1993 | Wert et al. | 327/108 |
| 5,258,667 A | * 11/1993 | Ohtake et al. | 326/21 |
| 5,260,861 A | 11/1993 | Wert | 363/25 |
| 5,272,615 A | 12/1993 | Wert | 363/41 |
| 5,281,682 A | * 1/1994 | Ma | 327/108 |
| 5,296,760 A | * 3/1994 | Oertle et al. | 326/62 |
| 5,543,739 A | * 8/1996 | Bontempo et al. | 327/108 |
| 5,546,043 A | * 8/1996 | Pollmeier | 327/427 |
| 5,550,501 A | * 8/1996 | Ito et al. | 327/374 |
| 5,625,312 A | * 4/1997 | Kawakami et al. | 327/483 |
| 5,777,461 A | 7/1998 | Massie et al. | 323/282 |
| 5,781,058 A | 7/1998 | Sanzo et al. | 327/387 |
| 5,850,158 A | * 12/1998 | Kattmann | 327/375 |
| 5,896,058 A | 4/1999 | Sanzo et al. | 327/432 |

* cited by examiner

Primary Examiner—Terry D. Cunningham
Assistant Examiner—Hai L. Nguyen

(57) ABSTRACT

A sharp transition is achieved between pushing and pulling an output current by simultaneously diverting the bias current from a series stacked transistor circuit and from the base of a sink transistor. After the series stacked transistor circuit is kept from conducting output current, the sink transistor allows bias current to drive the other transistor circuit in the stack. Each of the transistor circuits in the stack is associated with a bias current and a sink transistor. The sink transistors and the bottom transistor circuit in the stack have emitters coupled to a floating ground. A switching signal input circuit includes an input transistor and a current mirror. The low input signal from the switching signal input circuit to a control input at a first sink transistor in the drive circuit is clamped relative to the floating ground.

13 Claims, 1 Drawing Sheet

SHARP TRANSITION PUSH-PULL DRIVE CIRCUIT WITH SWITCHING SIGNAL INPUT CIRCUIT

FIELD OF THE INVENTION

In accordance with an embodiment of the invention, a push-pull drive circuit includes a first transistor circuit stacked in series with a second transistor circuit. One or the other of the first and second transistor circuits is atop the other. The transistor circuits alternately push and pull current through an output between the first and second transistor circuits. Each transistor circuit may be a single transistor, a Darlington pair of transistors or other circuit arrangement for pushing or pulling current. Bias currents for each of the first and second transistor circuits is provided. Operation of each transistor circuit is controlled by a sink transistor which selectively diverts the bias current away from its respective transistor circuit. When the sink transistor for the first transistor circuit diverts bias current from the first transistor circuit, it at the same time diverts the bias current from the base of the sink transistor for the second transistor circuit. It may in certain applications also be useful to provide a capacitor between the sink transistor for the first transistor circuit and the sink transistor for the second transistor circuit to more rapidly provide current to the second sink transistor when the first sink transistor switches from diverting current to allowing current to the first transistor circuit. In addition, it may be desirable to provide a capacitor having one end coupled to the bias current for the first transistor circuit and its other end coupled to ground so as to slow switching on of the first transistor circuit when the first sink transistor switches from diverting current to allowing current to the first transistor circuit.

In accordance with a method of changing states of first and second transistor circuits that form a push-pull drive circuit, a first bias current is provided to the first transistor circuit. A bias current is diverted from the second transistor into a sink transistor circuit to keep that second transistor circuit from conducting output current. The method then proceeds with simultaneously diverting the first bias current from the first transistor circuit and from the sink transistor. In this manner, the first transistor circuit is kept from conducting output current and then the sink transistor will allow the second bias current to drive the second transistor circuit.

According to a method of a further embodiment of the invention, a low input signal to a first sink transistor is clamped in relation to a voltage at an emitter of the first sink transistor. A first bias current is provided to the base of the first transistor circuit. A second bias current is diverted from the base of the second transistor circuit into a second sink transistor. The method goes on to raising the input signal to the first sink transistor to a high input signal. The first sink transistor responds by simultaneously diverting the first bias current from the base of the first transistor circuit and from the base of the second sink transistor. This switches off the first transistor circuit and allows second bias current to drive the second transistor circuit on.

A further embodiment of the invention is disclosed in which each of the first and second transistor circuits has an associated bias current. Also, each circuit has an associated sink transistor for selectively diverting bias current from its associated transistor circuit. The first sink transistor is arranged to divert bias current from its associated first transistor circuit and from the base of the other sink transistor. A ground referenced transistor has a collector coupled to the base of the first sink transistor. A diode clamp is connected between floating ground and the collector of the ground referenced transistor. Each of the sink transistors is also connected to the floating ground through their emitters.

A switching signal input circuit is also described for use with the drive circuit. An input transistor is responsive to a high or low voltage responding by sinking or allowing a first bias current to flow into a first transistor. The first transistor and a second transistor share a common base and both have emitters coupled to ground. A second bias current coupled to a control input of a drive circuit is controlled by the second transistor through its collector. The second transistor sinks the second bias current when the first bias current is allowed to flow into the first transistor of the switching signal input circuit and allows the second bias current to drive the control input of the drive circuit when the input transistor is sinking the first bias current. In addition, a diode clamp may be connected between the collector of the second transistor and the floating ground of the drive circuit.

Embodiments of the invention advantageously prevent cross-conduction between the stacked transistor circuits in one or both directions. Propagation delay of the switching signal is advantageously reduced by clamping a low control input to a floating ground from the drive circuit. Other objects and advantages of the invention will become apparent during the following description of the presently preferred embodiment of the invention taken in conjunction with the drawing.

BACKGROUND OF THE INVENTION

The present invention relates to a push-pull drive circuit. In particular, attention is given in the circuit to prevention of cross-conduction and reduction of propagation delay for the switching signal input.

Drive circuits arranged with series stacked transistors to drive a power transistor are well known in the art. These typically operate as a push-pull drive circuit in which the top transistor provides current out to the power transistor in a first state of the circuit, and in the second state of the circuit the bottom transistor pulls current from the power transistor to a ground. When current is flowing through one of the stacked transistors in saturation, power dissipation is low because the saturation voltage is very low. When a transistor is off, no current is flowing and no power is used by that transistor. However, during the transitions between the pushing and pulling states, power dissipation will increase particularly if both transistors in a stack are conducting at the same time. In order to minimize this power dissipation, it is highly desirable to prevent the transistors in the stack from being conductive at the same time. An example of a cross conduction prevention circuit is shown in U.S. Pat. No. 5,896,058. That patent discloses a complex circuit embodiment in which pairs of transistors arranged as NOR gates and a comparator are all provided to prevent cross conduction between stacked transistor circuits.

Such drive circuits may be used in a variety of applications. For example, a push-pull drive circuit can be used to drive a power transistor or a FET within a buck regulator. In order to maintain tight regulation, it is desirable that the switching signal to the drive circuit be acted upon without undue delay.

DETAIL DESCRIPTION OF THE DRAWINGS

Figure 1:
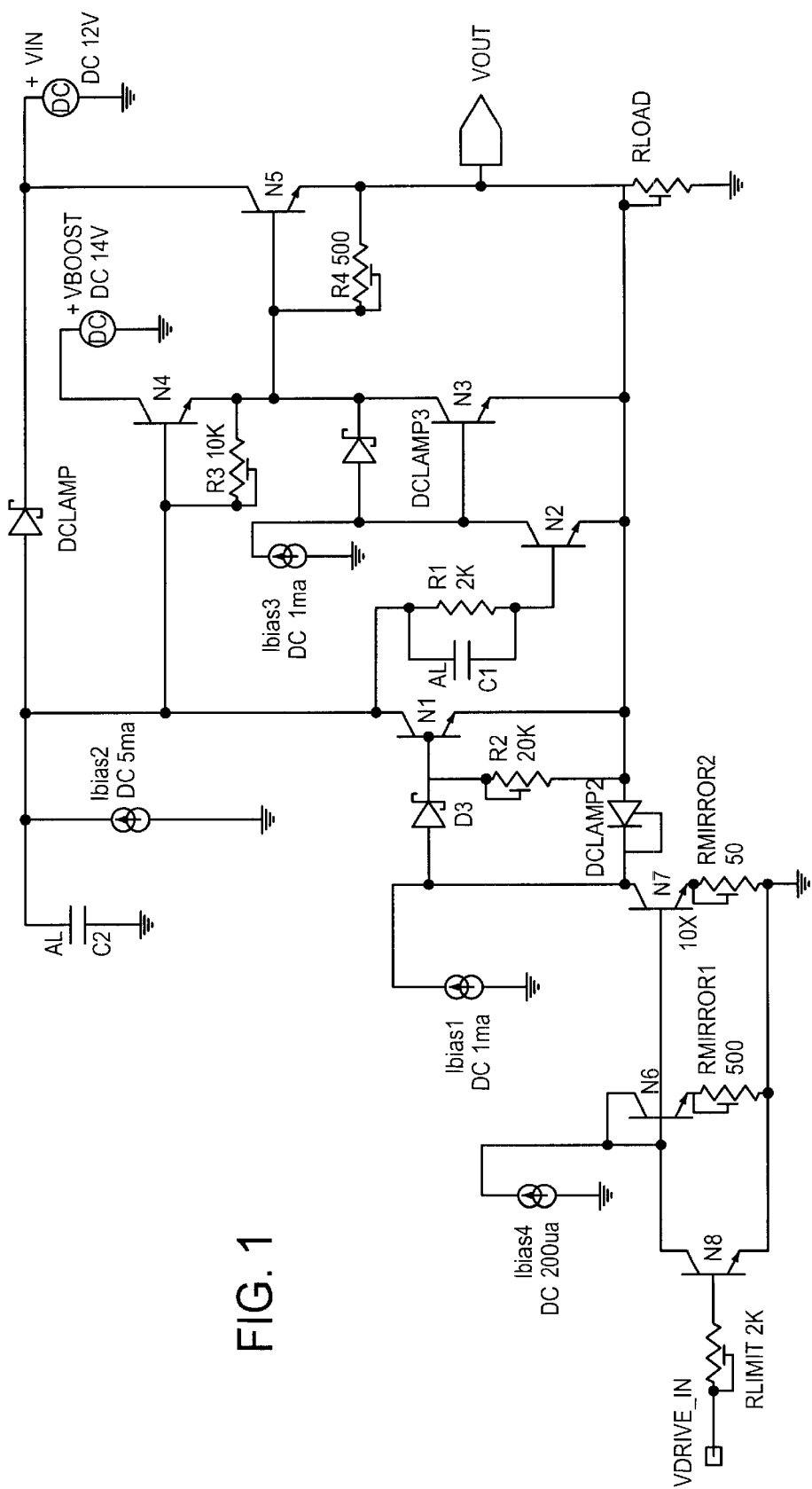
FIG. 1 is a schematic diagram incorporating the various embodiments of the invention.

Referring now to the drawing, embodiments of the push-pull drive circuit and switching signal input circuit are shown. A top transistor circuit N4 and a bottom transistor circuit N3 are stacked in series. The output of the drive circuit is taken from between these two stacked transistor circuits. In the embodiment shown, each of the transistor circuits is an NPN transistor. However, it is well within the scope of the present invention to substitute a Darlington pair of transistors or other suitable substitute for performing the functions of an output stage transistor circuit of the drive circuit. In the particular embodiment shown, the output current drives an NPN power transistor N5. The described circuit of the present invention may be used in other applications to drive a FET or other power switch. The circuit may advantageously be used in a buck regulator. The power output Vout is taken from the emitter of the power transistor N5. A voltage source Vin is connected to the collector of the power transistor N5. The voltage output Vout is allowed to be a floating ground to the drive circuit as in the embodiment shown. A floating ground may be pulled below ground making this circuit suitable for alternative use in a zeta converter for a buck regulator. The voltage source connected to the collector of the top transistor circuit in the stack needs to sufficiently exceed the input voltage Vin. This insures that when the power transistor N5 is on that there is enough voltage on the collector of the top transistor circuit N4 to keep it on to drive the power transistor and permits the voltage across N5 to be as small as possible to minimize power dissipation when N5 is conducting.

Each of the transistor circuits in the stack has associated with it a bias current which is connected to provide base drive current to the switching transistor circuits. The state of each transistor circuit is selectively controlled by an associated sink transistor. The top transistor circuit N4 has its base coupled to the collector of a first sink transistor N1. The emitter of sink transistor N1 is connected to the floating ground. The base of the first sink transistor N1 acts as the control input for the drive circuit and receives a switching signal from a switching signal input circuit. When the first sink transistor N1 is deprived of base current, the first bias current Ibias2 is available for driving the top transistor circuit N4. The first bias current Ibias2 is also available to a second sink transistor N2. When base current is provided to the first sink transistor N1, it diverts and sinks the bias current Ibias2. This simultaneously deprives the top transistor circuit N4 and the second sink transistor N2 of base drive current. This causes the voltage at the collector of the second sink transistor N2 to rise. A second bias current Ibias3 for the bottom transistor circuit N3 is coupled to the collector of the second sink transistor. Therefore, when bias current is permitted to the base of the second sink transistor N2, it diverts the second bias current Ibias3 away from the base of the bottom transistor circuit N3. When the first sink transistor N1 deprives the second sink transistor N2 of base drive current, the voltage at the base of bottom transistor N3 rises as the second bias current Ibias3 is allowed to drive the bottom transistor circuit N3. The emitters of the first sink transistor, the second sink transistor and the bottom transistor circuit are all coupled to the floating ground of the drive circuit.

In operation, a sharp transition is made possible between pushing and pulling an output current. By preventing cross conduction during the transition, little power is dissipated and the transition is thus sharp. In the first state of the circuit, a first bias current Ibias2 is provided to the top transistor circuit N4. Thus, transistor circuit N4 is conducting and providing output current through the output of the drive circuit. In this state, the first sink transistor N1 is not conducting. Base drive current from the first bias current Ibias2 is provided to the second sink transistor N2 which therefore diverts the second bias current Ibias3 away from the bottom transistor circuit N3. Thus, the top transistor circuit N4 is on when the bottom transistor circuit N3 is off. When the signal to the first sink transistor N1 changes to a high signal providing base drive current to the first sink transistor N1, the first sink transistor N1 simultaneously diverts the first bias current Ibias2 away from the top transistor circuit and from the second sink transistor N2. The top transistor circuit is thus turned off keeping it from pushing output current through the output. The bottom transistor circuit N3 must wait for the second sink transistor N2 to change state and allow the second bias current Ibias3 to feed its base with drive current before it can switch on. Therefore, the second sink transistor N2 during this transition prevents the bottom transistor circuit N3 from turning on until the top transistor circuit N4 has turned off. Thus, the transition is sharp with little or no cross-conduction of current between the top and bottom transistor circuits. In the presently preferred embodiment as shown, there is no cross-conduction in this transition.

Going in the opposite direction now, the switching signal to the first sink transistor N1 is changed from high to low and the base of the first sink transistor is deprived of base drive current. The top transistor circuit is then allowed to receive the first bias current Ibias2. The second sink transistor also receives base drive current and begins diverting bias current Ibias3 away from the bottom transistor circuit N3. As described, there may be some minor overlap in time when both the top transistor circuit N4 and bottom transistor circuit N3 are simultaneously conducting. Without optional capacitors C1 and C2, the overlap in the preferred embodiment may be approximately 15 nanoseconds. If such an overlap is unacceptable to the overall circuit design either or both of capacitor C1 or C2 may be added to the drive circuit.

Capacitor C1 is connected between the collector of the first sink transistor and the base of the second sink transistor. When the first sink transistor N1 shuts off, first bias current Ibias2 is immediately injected through the capacitor C1 to the base of second sink transistor N2. This increases the speed with which second sink transistor N2 begins diverting bias current away from the bottom of transistor circuit N3. Alternatively or in addition, capacitor C2 is connected with one end coupled to the first bias current Ibias2 and the other end connected to ground. Thus, when the first sink transistor N1 is switched off, the bias current Ibias2 must begin charging capacitor C2 before the top transistor circuit N4 can be switched on. This effectively slows the switching on of the top transistor circuit N4. A circuit designer may adapt the values of capacitor C1 and C2 and may select to use both, either one or none of these capacitors to achieve the desired performance for the circuit application being built.

It is desirable that the switching signals are acted upon in a timely manner. A drive circuit of the type shown with stacked series connected transistor circuits and a floating ground connected to the emitters of the sink transistors and the bottom transistor circuit would benefit from a switching signal input with low propagation delays. Propagation delay of the input signal can be improved by providing a diode clamp connected between the floating ground and the collector of a ground referenced transistor N7. The ground referenced transistor N7 steers bias current Ibias1 to or away from the control input of the drive circuit at the base of the first sink transistor N1. The ground referenced transistor N7 alternates between a state which is on, steering current away from the first sink transistor N1 and off, which is nonconducting and permits the bias current Ibias1 to drive the first sink transistor N1. Typically, the collector of the ground referenced transistor N7 would alternate between a high voltage and a low voltage close to ground. In order to more quickly transition from low to high at the control input, the diode clamp keeps the voltage at the collector of the ground referenced transistor from falling lower than 1 Vbe beneath the floating ground voltage. This voltage is low enough to hold the first sink transistor N1 off as the emitter of the first sink transistor is connected to floating ground. But the voltage is higher than the voltage at the emitter of the ground referenced transistor N7 when N7 is conducting, so that there is a much shorter transition at the collector of N7 from low voltage state to its high voltage state. This transition can therefore take place more quickly.

The switching signal input circuit which takes a basic high/low voltage signal and produces a current that either is allowed or diverted away from the control input of the drive circuit shall now be described in greater detail. An input transistor N8 receives the high/low voltage signal at its base. The emitter of transistor N8 is coupled to ground. The collector of transistor N8 is connected to a bias current Ibias4. A current mirror formed by transistor N6 and transistor N7 is also connected to the bias current Ibias4. The base and the collector of transistor N6 are connected to the bias current Ibias4. In order to make the current mirror a multiplier of current, resistors of different values may be connected to the emitters of the current mirror resistors and/or the emitters can be made relatively different in size. The current mirror should be arranged so that when ground referenced transistor N7 conducts, it pulls all of Ibias1 current. Thus, in the preferred embodiments, the emitter of transistor N6 is coupled to ground through a resistor RMIR-ROR1. The ground referenced transistor N7 shares a common base with transistor N6 to form the current mirror. The collector of ground referenced transistor N7 is connected to a bias current Ibias1 which will selectively drive the control input of the drive circuit. The emitter of ground referenced transistor N7 is coupled to ground through a resistor RMIR-ROR2.

When a low input is provided, the input transistor N8 is off and bias current Ibias4 is allowed to flow through the first transistor N6 in the current mirror. That current is mirrored in the ground referenced transistor N7. The current mirror is proportioned so that when ground referenced transistor N7 is thus conducting, it is diverting the bias current Ibias1 away from the control input to the drive circuit. When the switching signal goes high in the input transistor N8, transistor N8 switches on diverting the bias current Ibias4 away from transistor N6. Ground referenced transistor N7 stops conducting and the bias current Ibias1 is allowed to drive the input of the drive circuit. When the drive circuit has a floating ground, it may be desirable to include a diode clamp connected between the collector and ground referenced transistor N7 and floating ground. This advantageously reduces the voltage swing at the control input of the drive circuit thereby reducing the time required to make a transition from one state to another.

Of course, it should be understood that various changes and modifications to the preferred embodiments described above will be apparent to those skilled in the art. For example, a wide variety of drive circuits may be used with a switching signal input circuit of the invention. Also, the transistor circuits that are stacked in series may be designed with a different number and different types of transistors. Furthermore, whereas in the embodiment shown herein the second sink transistor is interposed between the first sink transistor and the bottom transistor circuit, other embodiments could instead interpose the second sink transistor between the first sink transistor and the top transistor circuit. As such, the top transistor circuit would be associated with the second sink transistor and the second bias current, and the bottom transistor circuit would be associated with the first sink transistor and the first bias current. These and other changes can be made without departing from the spirit and scope of the invention and without diminishing its attendant advantages. It is therefore intended that such changes and modifications be covered by the following claims.

What is claimed is:

1. A driver circuit generating first and second control signals to control the conduction state of an output stage, the driver circuit comprising:
   a current mirror circuit coupled to receive an input signal and coupled to receive a bias signal to produce the first control signal at a first node in a first mode of operation; and
   a timing control circuit having
      a first capacitor having a first conductor coupled to the first node and a second conductor coupled to receive a first supply potential;
      a second capacitor having a first conductor coupled to the first node and a second conductor coupled to provide a third control signal at a second node; and
      a resistor having a first conductor coupled to the first node and a second conductor coupled to the second node.

2. The driver circuit of claim 1, wherein the current mirror circuit comprises:
   a first transistor having a control terminal coupled to receive the input signal;
   a second transistor having a control terminal coupled to receive the input signal and a conduction terminal coupled to provide a bias control signal; and
   a third transistor having a control terminal coupled to receive the bias control signal and a conduction terminal coupled to receive the bias signal during the first mode of operation.

3. The driver circuit of claim 1 further comprising an output stage coupled to receive the first and second control signals and coupled to provide an output signal at an output node.

4. A method of operating a drive circuit, comprising:
   activating a current mirror with an input signal to generate a first control signal in a first mode of operation;
   deactivating the current mirror with the input signal to generate a second control signal in a second mode of operation; and
   charging a capacitor to delay the second control signal with respect to the first control signal to substantially prohibit simultaneous first and second modes of operation.

5. The method of claim 4, wherein activating the current mirror comprises:
   transitioning a first transistor to a first conductive state in response to a first level of the input signal;
   transitioning a second transistor to a second conductive state in response to the first level of the input signal; and
   conducting a bias signal with a third transistor in response to the first level of the input signal.

6. The method of claim 5, wherein deactivating the current mirror comprises:
   transitioning the first transistor to a second conductive state in response to a second level of the input signal; and transitioning the second transistor to a second conductive state in response to the second level of the input signal.

7. The method of claim 5 wherein charging a capacitor to delay the second control signal with respect to the first control signal comprises redirecting the bias signal through a capacitive network.

8. An integrated driver circuit, comprising:

an output stage having an output for providing an output signal of the integrated driver circuit; and a timing control circuit including a first switch operating in response to an input signal of the timing control circuit for routing a first current to a first input of the output stage to provide a first drive signal;

a second switch having a control electrode coupled to the first input of the output stage for routing a second current to a second input of the output stage to provide a second drive signal; and a first capacitor coupled to the first input of the output stage for delaying the first drive signal.

9. The driver circuit of claim 8 wherein the output stage comprises:

a push transistor having a control terminal coupled to the first drive signal and having a conduction terminal coupled to the output; and a pull transistor having a control terminal coupled to receive the second drive signal and having a conduction terminal coupled to the output.

10. The timing control circuit of claim 8 wherein the first switch comprises a transistor coupled to a first conductor of the first capacitor and a first conductor or a second capacitor.

11. The timing control circuit of claim 8 wherein the second switch comprises a transistor coupled to a second conductor of a second capacitor.

12. A method of operating a timing control circuit, comprising the steps of:

activating a first switch with an input signal to route a first current to a first input of an output stage to provide a first drive signal;

activating a second switch with the input signal to route a second current to a second input of the output stage to provide a second drive signal; and using a first capacitor coupled to the first input of the output stage for delaying the first drive signal.

13. The method of claim 12 wherein the step of using a first capacitor further comprises the step of charging the first capacitor to delay the first drive signal with respect to the second drive signal to substantially prohibit simultaneous presentation of the first and second drive signals at the first and second inputs of the output stage.

* * * * *